United States Patent
Oh et al.

(10) Patent No.: US 8,023,356 B2
(45) Date of Patent: Sep. 20, 2011

(54) VOLTAGE LEVEL COMPARISON CIRCUIT OF SEMICONDUCTOR MEMORY APPARATUS, VOLTAGE ADJUSTMENT CIRCUIT USING VOLTAGE LEVEL COMPARISON CIRCUIT, AND SEMICONDUCTOR MEMORY APPARATUS USING THE SAME

(75) Inventors: Ic-Su Oh, Ichon (KR); Yong-Ju Kim, Ichon (KR); Sung-Woo Han, Ichon (KR); Hee-Woong Song, Ichon (KR); Hyung-Soo Kim, Ichon (KR); Tae-Jin Hwang, Ichon (KR); Hae-Rang Choi, Ichon (KR); Ji-Wang Lee, Ichon (KR); Jae-Min Jang, Ichon (KR); Chang-Kun Park, Ichon (KR)

(73) Assignee: Hynix Semicondutor, Inc. (KR)

( * ) Notice: Subject to any disclaimer, the term of this patent is extended or adjusted under 35 U.S.C. 154(b) by 395 days.

(21) Appl. No.: 12/336,423

(22) Filed: Dec. 16, 2008

(65) Prior Publication Data
US 2009/0257301 A1    Oct. 15, 2009

(30) Foreign Application Priority Data
Apr. 11, 2008    (KR) .................. 10-2008-0033630

(51) Int. Cl.
*G11C 5/14* (2006.01)
(52) U.S. Cl. ............... 365/226; 365/227; 365/189.02; 365/189.07; 365/189.09
(58) Field of Classification Search ........... 365/226, 365/227, 189.07, 189.02, 189.09
See application file for complete search history.

(56) References Cited

U.S. PATENT DOCUMENTS

| 6,157,180 A | 12/2000 | Kuo |
| 7,227,792 B2* | 6/2007 | Takahashi et al. ....... 365/189.09 |
| 7,332,895 B2 | 2/2008 | Wei |
| 2007/0041425 A1* | 2/2007 | Lee et al. ..................... 374/208 |

FOREIGN PATENT DOCUMENTS

| JP | 2003-023346 | 1/2003 |
| KR | 1020030057885 A | 7/2003 |
| KR | 1020040079119 A | 9/2004 |

* cited by examiner

*Primary Examiner* — Son Dinh
(74) *Attorney, Agent, or Firm* — Baker & McKenzie LLP

(57) ABSTRACT

A voltage adjustment circuit of a semiconductor memory apparatus includes a control voltage generating unit configured to distribute an external voltage for selectively outputting a plurality of distribution voltages as a control voltage in response to a control signal, the plurality of the distribution voltages each have different voltage levels, a comparing unit configured to include a voltage supply unit configured to control an external voltage supplied to a first node and a second node if a level of an output voltage is higher than a level of a reference voltage in response to a level of the control voltage, and a detection signal generating unit configured to drop potential levels of the first and second nodes according to the levels of the output voltage and the reference voltage, and to output the potential level of the second node as a detection signal, and a voltage generating unit configured to drive the external voltage according to a potential level of the detection signal and to output the external voltage as the output voltage.

21 Claims, 2 Drawing Sheets

VOLTAGE LEVEL COMPARISON CIRCUIT OF SEMICONDUCTOR MEMORY APPARATUS, VOLTAGE ADJUSTMENT CIRCUIT USING VOLTAGE LEVEL COMPARISON CIRCUIT, AND SEMICONDUCTOR MEMORY APPARATUS USING THE SAME

CROSS-REFERENCES TO RELATED PATENT APPLICATION

The present application claims priority under 35 U.S.C 119(a) to Korean Application No. 10-2008-0033630, filed on Apr. 11, 2008, in the Korean Intellectual Property Office, which is incorporated herein by reference in its entirety as set forth in full.

BACKGROUND

1. Technical Field

The embodiments described herein relate to a semiconductor memory apparatus, and more particularly, to a voltage level comparison circuit, a voltage adjustment circuit using the voltage level comparison circuit, and a semiconductor memory apparatus using the same.

2. Related Art

In general, a semiconductor memory apparatus drops/reduces an external voltage and generates a voltage having a desired level. Here, a circuit that drops the external voltage and generates a stable voltage is commonly called a voltage regulator or a voltage adjustment circuit. Here, the voltage adjustment circuit has been widely used as an internal voltage generation circuit that generates an internal voltage.

FIG. 1 is a schematic diagram of a conventional voltage adjustment circuit of a semiconductor memory apparatus. In FIG. 1, a voltage adjustment circuit 1 includes a comparison unit 10 and a voltage generating unit 20.

The comparison unit 10 compares levels of a reference voltage Vref and an output voltage V_out, and generates a detection signal 'det'. The comparison unit 10 includes first to fourth transistors P1, P2, N1, and N2. The first transistor P1 is supplied with an external voltage VDD through a source terminal thereof, and supplies a voltage to a first node (node A) that is connected to a drain terminal thereof. The second transistor P2 is supplied with the external voltage VDD through a source terminal thereof, and supplies a voltage to a second node (node B) that is connected to a drain terminal thereof. In the third transistor N1, the output voltage V_out is supplied to a gate terminal thereof, a ground terminal VSS is connected to a source terminal thereof, and the first node (node A) is connected to a drain terminal thereof. In the fourth transistor N2, the reference voltage Vref is supplied to a gate terminal thereof, the ground terminal VSS is connected to a source terminal thereof, and the second node (node A) is connected to a drain terminal thereof.

Here, the detection signal 'det' is output from the second node (node A). In addition, the voltage generating unit 20 drives an external voltage VDD according to a potential level of the detection signal 'det' and generates the output voltage V_out. The voltage generating unit 20 includes a fifth transistor P3, a resistor element R1, and a capacitor C1. In the fifth transistor P3, the detection signal 'det' is supplied to a gate terminal thereof, the external voltage VDD is supplied to a source terminal thereof, and the output voltage V_out is output from a drain terminal thereof. The resistor element R1 and the capacitor C1 are connected in parallel and are connected between the drain terminal of the fifth transistor P3 and the ground terminal VSS. Here, the resistor element R1 and the capacitor C1 that are connected in parallel function as a filter that directs noise of the output voltage V_out to the ground terminal VSS.

In the voltage adjustment circuit 1, if the noise is generated in the external voltage VDD, then the noise is also generated in the output voltage V_out. Specifically, a potential level of the second node (node B), i.e., a potential level of the detection signal 'det', is generated by supplying the external voltage VDD to the second node (node B) when the second transistor P2 is turned ON. Thus, the noise of the external voltage VDD is output as the detection signal 'det' without being removed. Here, the detection signal 'det' that includes the noise is supplied to the gate terminal of the fifth transistor P3 but does not fix a turned-ON degree of the fifth transistor P3. Accordingly, the output voltage V_out that is output from the fifth transistor P3 also includes the noise.

SUMMARY

A voltage level comparison circuit, a voltage adjustment circuit using the voltage level comparison circuit, and a semiconductor memory apparatus having the same is described herein.

In one aspect, a voltage adjustment circuit of a semiconductor memory apparatus includes a control voltage generating unit configured to selectively output a plurality of distribution voltages as a control voltage in response to a control signal, the plurality of the distribution voltages each having a different voltage level, a comparing unit configured to receive the control voltage, and external voltage and a reference voltage, and to output a detection voltage, and a voltage generating unit configured to generate an output voltage based on the detection signal.

In another aspect, a voltage level comparison circuit of a semiconductor memory apparatus includes a control voltage generating unit configured to selectively output control voltages having different levels in response to a control signal, a voltage supply unit configured to supply an external voltage to first and second nodes according to a potential level of the first node, and a detection signal generating unit configured to drop the potential levels of the first and second nodes according to levels of an output voltage and a reference voltage, and to output the potential level of the second node as a potential level of a detection signal, wherein the voltage supply unit controls the external voltage that is supplied to the first and second nodes according to a level of the control voltage.

In another aspect, a semiconductor memory apparatus includes a voltage adjustment circuit having a voltage distributing unit configured to generate a plurality of distributed voltages based on an external voltage, a multiplexer configured to selectively output the plurality of distribution voltages as a control voltage in response to a control signal, a plurality of drivers, each configured to drive the external voltage and to provide a driving voltage to one of a first node and a second node according to the potential level of the first node, a plurality of transistors, each having a gate terminal receiving one of the output voltage and the reference voltage, a drain terminal connected to one of the first node and the second node, and a source terminal connected to a ground terminal, a driver configured to drive the external voltage according to the potential level of the detection signal and to output the external voltage as an output voltage, and a filter configured to remove noise of the output voltage.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
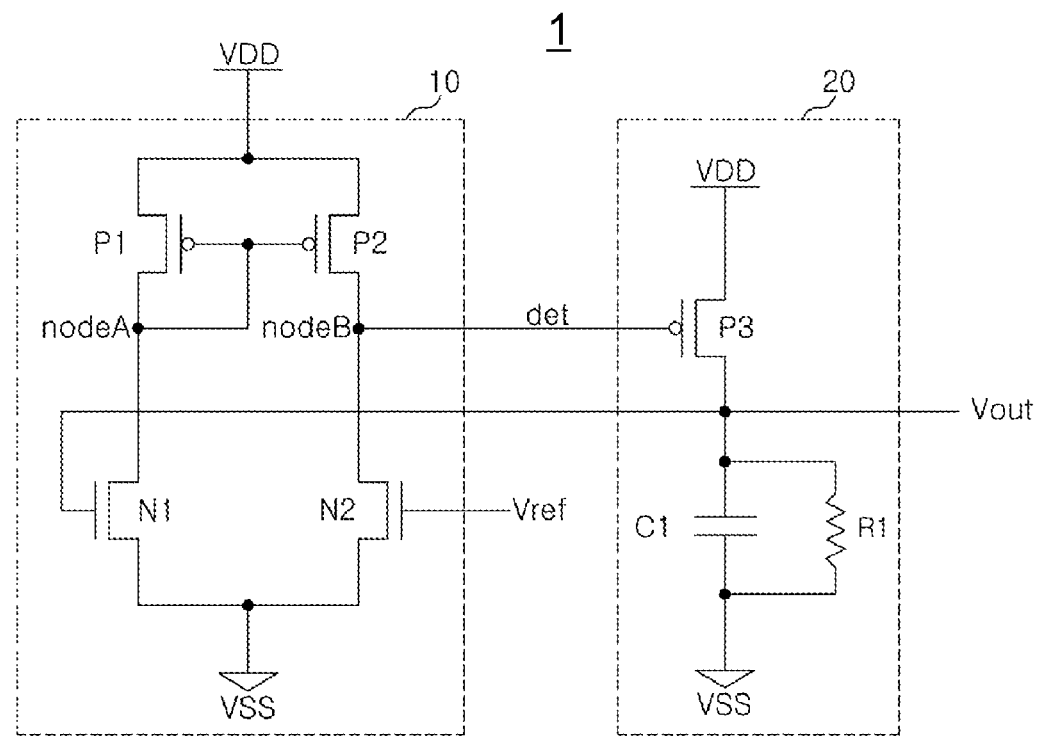
FIG. 1 is a schematic diagram of a conventional voltage adjustment circuit of a semiconductor memory apparatus.
Figure 2:
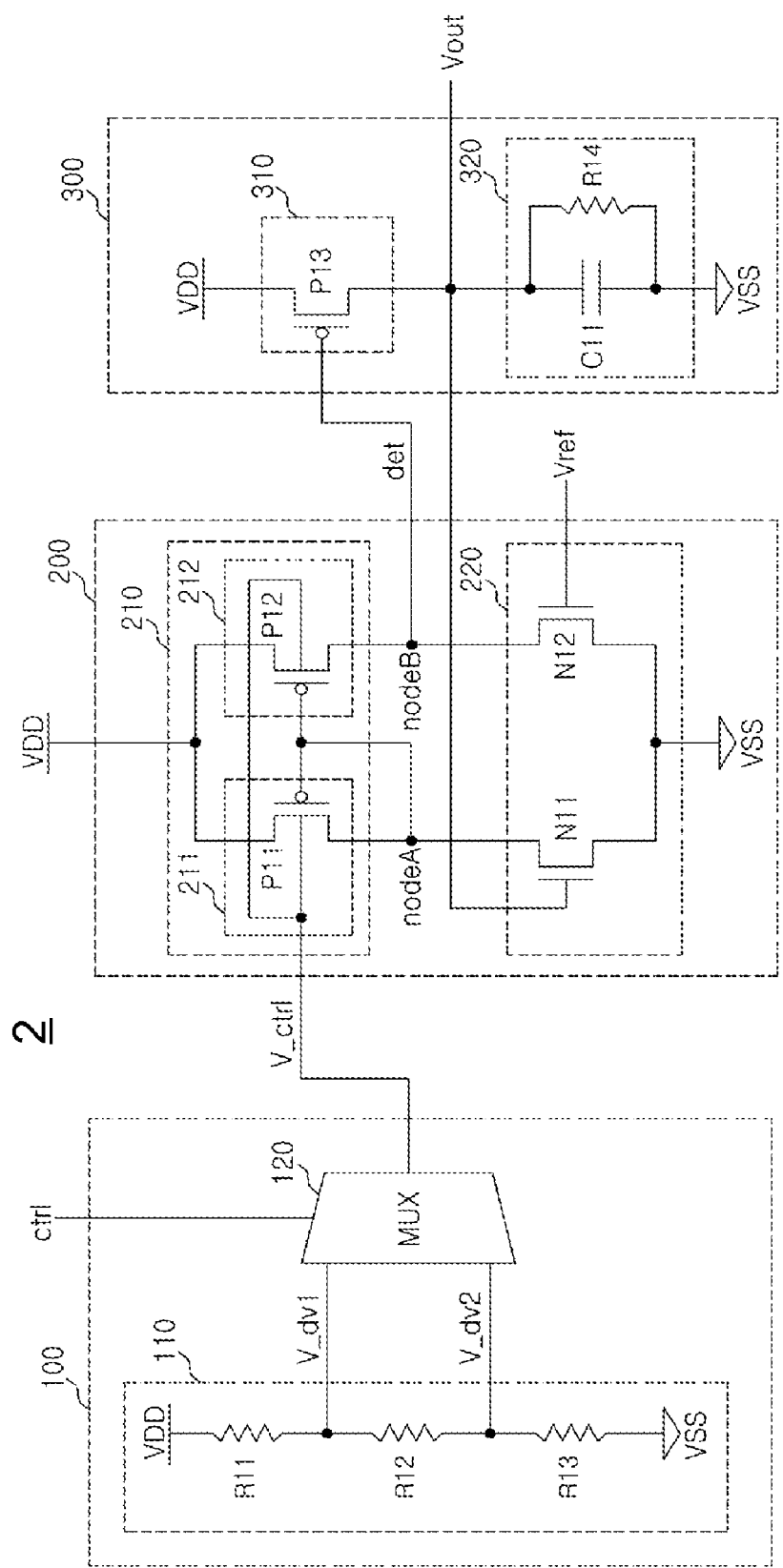
FIG. 2 is a schematic diagram of an exemplary voltage adjustment circuit of a semiconductor memory apparatus according to one embodiment.

FIG. 2 is a schematic diagram of an exemplary voltage adjustment circuit 2 of a semiconductor memory apparatus according to one embodiment. In FIG. 2, the voltage adjustment circuit 2 of a semiconductor memory apparatus can be configured to include a control voltage generating unit 100, a comparing unit 200, and a voltage generating unit 300.

The control voltage generating unit 100 can be configured to selectively output a first distribution voltage V_dv1 or a second distribution voltage V_dv2 as a control voltage 'V_ctrl' in response to a control signal 'ctrl'. Here, the first distribution voltage V_dv1 can be different from the second distribution voltage V_dv2.

The control voltage generating unit 100 can be configured to include a voltage distributing unit 110 and a multiplexer (MUX) 120. The voltage distributing unit 110 can be configured to generate the first and second distribution voltages V_dv1 and V_dv2 by dividing an external voltage, in this case external supply voltage VDD. For example, the voltage distributing unit 110 can be configured to include first to third resistor elements R11 to R13. The first to third resistor elements R11 to R13 can be connected in series between an external voltage terminal VDD and a ground terminal VSS. Here, the first distribution voltage V_dv1 can be output from a node that is connected to the first and second resistor elements R11 and R12, and the second distribution voltage V_dv2 can be output from a node that is connected to the second and third resistor elements R12 and R13.

The multiplexer 120 can be configured to selectively output the first distribution voltage V_dv1 or the second distribution voltage V_dv2 as the control voltage V_ctrl in response to the control signal 'ctrl'. Here, the control signal 'ctrl' can be a test signal that is generated during a test mode. In addition, the level of the control signal 'ctrl' can be fixed depending on whether a fuse is cut one the test is finished.

The comparing unit 200 can be configured to include a voltage supply unit 210 and a detection signal generating unit 220. When a level of an output voltage V_out becomes higher than a level of a reference voltage Vref, i.e., a potential level of the first node (node A), decreases, the voltage supply unit 210 can be configured to drive the external voltage VDD and supply the external voltage to the first and second nodes (node A) and (node B). Here, in the voltage supply unit 210, whether the external voltage VDD that is supplied to the first and second nodes (node A) and (node B) can be based on a level of the control voltage V_ctrl. For example, the voltage supply unit 210 can be configured to include a first transistor P11 as a first driver 211 and a second transistor P12 as a second driver 212.

In the first transistor P11, the first node (node A) can be connected to gate and drain terminals thereof, the external voltage VDD can be supplied to a source terminal thereof, and the control voltage V_ctrl can be supplied to a bulk terminal thereof. In the second transistor P12, the first node (node A) can be connected to a gate terminal thereof, the external voltage VDD can be supplied to a source terminal thereof, a drain terminal thereof can be connected to the second node (node B), and the control voltage V_ctrl can be supplied to a bulk terminal thereof.

In general, a threshold voltage of a transistor can increase when a difference in a voltage level between a source terminal and a bulk terminal increases. In contrast, the threshold voltage can decrease when a difference in a voltage level between the source terminal and the bulk terminal decreases. Further, the transistor can be turned ON only when a difference in a voltage level between a gate terminal and a source terminal is higher than a level of the threshold voltage. Thus, a turned-on degree (or performance) of the transistor can increase when the difference in a voltage level between the gate terminal and the source terminal is higher than the level of the threshold voltage.

Accordingly, in the first and second transistors P11 and P12, the threshold voltage level can be determined by a difference in a voltage level between the external voltage VDD and the control voltage V_ctrl. Thus, the turn on for each of transistors P11 and P12 can be determined from the degree (performance) to which a difference in a voltage level between the external voltage VDD supplied to each source terminal of the first and second transistors P11 and P12 and a voltage supplied to each gate terminal is different from the threshold voltage level as determined by the control voltage 'V_ctrl'.

Finally, the turned-ON degree of the first driver 211 and the second driver 212 can be determined by a level of the control voltage V_ctrl, wherein the first and second drivers 211 and 212 can be turned ON or turned OFF according to the potential level of the first node (node A). For example, the external voltage VDD that is supplied to each of the first and second nodes (node A) and (node B) can be determined by the turned-ON degree of each of the first and second drivers 211 and 212. Here, if the external voltage VDD that is supplied to the first and second nodes (node A) and (node B) increases, then an increase rate of the potential levels of the first and second nodes (node A) and (node B) can increase. If the external voltage VDD that is supplied to the first and second nodes (node A) and (node B) decreases, then an increase rate of the potential levels of the first and second nodes (node A) and (node B) can decrease.

The voltage supply unit 220 can drop the potential levels of the first and second nodes (node A) and (node B) according to the levels of the output voltage V_out and the reference voltage Vref. For example, the voltage supply unit 220 can be configured to include third and fourth transistors N11 and N12. In the third transistor N11, the output voltage V_out can be supplied to a gate terminal thereof, the first node (node A) can be connected to a drain terminal thereof, and a ground terminal VSS can be connected to a source terminal thereof. In the fourth transistor N12, the reference voltage Vref can be supplied to a gate terminal thereof, the second node (node B) can be connected to a drain terminal thereof, and the ground terminal VSS can be connected to a source terminal thereof. Here, the potential level of the second node (node B) can be output as the potential level of the detection signal 'det'.

The voltage generating unit 300 can be configured to drive the external voltage VDD according to the potential level of the detection signal 'det', and can output the external voltage VDD as the output voltage V_out. For example, the voltage generating unit 300 can be configured to include a third driver 310 and a filter 320.

The third driver 310 can drive the external voltage VDD according to the potential level of the detection signal 'det', and can output the external voltage as the output voltage V_out. For example, the third driver 310 can be configured to include a fifth transistor P13. In the third driver 310, the detection signal 'det' can be input to a gate terminal thereof, the external voltage VDD can be supplied to a source terminal thereof, and a drain thereof can function as an output terminal of the third driver 310.

The filter 320 can be connected between the output terminal of the third driver 310 and the ground terminal VSS, and can remove noise that is included in an output from the third driver 310. Here, the output voltage V_out can be output from a node to which the third driver 310 and the filter 320 are connected. In the filter 320, a fourth resistor element R14 and a capacitor C11 that are connected in parallel can be connected between the output terminal of the third driver 310 and the ground terminal VSS.

An exemplary operation of the voltage adjustment circuit 2 of the semiconductor memory apparatus with reference to FIG. 2.

In FIG. 2, the voltage adjustment circuit 2 of the semiconductor memory apparatus can determine the level of the control voltage V_ctrl according to the control signal 'ctrl' during a test and monitor noise included in the output voltage V_out according to the level of the control voltage V_ctrl. After the test is finished, the level of the control signal 'ctrl' where the output voltage V_out having a desired waveform generated can be fixed through fuse cutting.

In FIG. 2, the voltage distributing unit 110 can distribute the external voltage VDD to generate first and second distribution voltages V_dv1 and V_dv2. Here, the level of the first distribution voltage V_dv1 can be higher than the level of the second distribution voltage V_dv2.

The multiplexer 120 can selectively output the first distribution voltage V_dv1 or the second distribution voltage V_dv2 as the control voltage V_ctrl in response to the control signal 'ctrl'.

In the first and second transistors P11 and P12 that constitute the voltage supply unit 210, the control voltage V_ctrl can be supplied to the bulk terminals thereof. Meanwhile, if the level of the output voltage V_out becomes higher than the level of the reference voltage Vref, then the voltage supply unit 210 can supply a voltage to the first and second nodes (node A) and (node B). Here, when the level of the control voltage V_ctrl is substantially equal to the level of the second distribution voltage V_dv2, not the level of the first distribution voltage V_dv1, the turned-ON degree when the first and second transistors P11 and P12 are turned ON can increase. For example, when the level of the control voltage V_ctrl is not high but low, if the first and second transistors P11 and P12 are turned ON, then an increase rate of the potential levels of the first and second nodes (node A) and (node B) can increase.

In contrast, when the level of the control voltage V_ctrl is not low but high, if the first and second transistors P11 and P12 are turned ON, then an increase rate of the potential levels of the first and second nodes (node A) and (node B) can decrease. For example, since the potential level of the second node (node B) is the potential level of the detection signal 'det', the detection signal 'det' rarely includes noise from the external voltage VDD when an increase rate of the potential level of the second node (node B) decreases. If the level of the output voltage V_out becomes higher than the level of the reference voltage Vref, then the detection signal generating unit 220 can drop the potential level of the first node (node A). If the level of the output voltage V_out becomes lower than the level of the reference voltage Vref, then the detection signal generating unit 220 can drop the potential level of the second node (node B). If the potential level of the second node (node B) is dropped, then the detection signal 'det' can become enabled.

After receiving the enabled detection signal 'det', the voltage generating unit 300 can output the output voltage V_out having a level that corresponds to the level of the detection signal 'det'. Accordingly, the voltage adjustment circuit 2 of the semiconductor memory apparatus can determine the level of the control voltage V_ctrl in response to the control signal 'ctrl' and reduce noise of the external voltage VDD of the detection signal 'det' according to the control voltage V_ctrl having the determined level. As a result, the voltage adjustment circuit 2 can reduce the noise of the output voltage V_out.

The voltage adjustment circuit 2 of the semiconductor memory apparatus can maximally suppress noise occurring in the output voltage, even though the noise occurs in the external voltage. Accordingly, a voltage can be stably supplied, thereby improving operation stability of the semiconductor memory apparatus.

While certain embodiments have been described above, it will be understood that the embodiments described are by way of is example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A voltage adjustment circuit of a semiconductor memory apparatus, comprising:
   a control voltage generating unit configured to selectively output a plurality of distribution voltages as a control voltage in response to a control signal, the plurality of the distribution voltages each having a different voltage level;
   a comparing unit configured to receive the control voltage, and external voltage and a reference voltage, and to output a detection voltage; and
   a voltage generating unit configured to generate an output voltage based on the detection signal,
   wherein the comparing unit includes:
   a first node and a second node;
   a voltage supply unit configured to supply the external voltage the first and second nodes if a level of the output voltage is higher than a level of the reference voltage in response to the control voltage; and
   a detection signal generating unit configured to drop potential levels of the first and second nodes according to the levels of the output voltage and the reference voltage, and to output the potential level of the second node as the detection signal.

2. The voltage adjustment circuit of claim 1, wherein the voltage generating unit is further configured to receive an external voltage and to drive the external voltage according to a potential level of the detection signal and to output the external voltage as the output voltage.

3. The voltage adjustment circuit of claim 1, wherein the control voltage generating unit includes:
   a voltage distributing unit configured to generate the plurality of distributed voltages based on the external voltage; and
   a multiplexer configured to selectively output the plurality of distribution voltages as the control voltage in response to the control signal.

4. The voltage adjustment circuit of claim 1, wherein the voltage supply unit is configured to supply the external voltage to the first and second nodes to increase the potential levels of the first and second nodes when the potential level of the first node is dropped.

5. The voltage adjustment circuit of claim 4, wherein the voltage supply unit is configured such that a rate of increase of the potential levels of the first and second nodes is controlled according to the level of the control voltage when the external voltage is supplied to the first and second nodes.

6. The voltage adjustment circuit of claim 5, wherein the voltage supply unit includes:
a first driver configured to drive the external voltage and to provide a driving voltage to the first node according to the potential level of the first node; and
a second driver configured to drive the external voltage and to supply a driving voltage to the second node according to the potential level of the first node, and
wherein a driving performance of each of the first and second drives is controlled according to the level of the control voltage.

7. The voltage adjustment circuit of claim 6, wherein the voltage supply unit includes:
a first transistor configured to function as the first driver and to include gate and drain terminals to which the first node is connected, a source terminal to which the external voltage is supplied, and a bulk terminal to which the control voltage is applied; and
a second transistor configured to function as the second driver and to include a gate terminal to which the first node is connected, a source terminal to which the external voltage is supplied, a drain terminal to which the second node is connected, and a bulk terminal to which the control voltage is supplied.

8. The voltage adjustment circuit of claim 1, wherein the detection signal generating unit includes:
a first transistor configured to include a gate terminal to which the output voltage is supplied, a drain terminal to which the first node is connected, and a source terminal to which a ground terminal is connected; and
a second transistor configured to include a gate terminal to which the reference voltage is supplied, a drain terminal to which the second node is connected, and a source terminal to which the ground terminal is connected.

9. The voltage adjustment circuit of claim 2, wherein the voltage generating unit includes:
a driver configured to drive the external voltage according to the potential level of the detection signal and to output the external voltage as an output voltage; and
a filter configured to remove noise of the output voltage.

10. A voltage level comparison circuit of a semiconductor memory apparatus, comprising:
a control voltage generating unit configured to selectively output control voltages having different levels in response to a control signal;
a voltage supply unit configured to supply an external voltage to first and second nodes of the voltage supply unit according to a potential level of the first node; and
a detection signal generating unit configured to drop the potential levels of the first and second nodes according to levels of an output voltage and a reference voltage, and to output the potential level of the second node as a potential level of a detection signal,
wherein the voltage supply unit controls the external voltage that is supplied to the first and second nodes according to a level of the control voltage.

11. The voltage level comparison circuit of claim 10, wherein the control voltage generating unit includes:
a voltage distributing unit configured to distribute the external voltage to generate first and second distribution voltages having different levels; and
a multiplexer configured to selectively output one of the first distribution voltage and the second distribution voltage as the control voltage in response to the control signal.

12. The voltage level comparison circuit of claim 10, wherein the voltage supply unit includes:
a first driver configured to perform a driving operation according to the potential level of the first node and to supply a voltage to the first node; and
a second driver configured to perform a driving operation according to the potential level of the first node and to supply a voltage to the second node,
wherein each of the first and second drivers differently drives the external voltage according to the level of the control voltage.

13. The voltage level comparison circuit of claim 12, wherein the first driver is configured to include a first transistor having a gate terminal to which the first node is connected, a source terminal to which the external voltage is supplied, a drain terminal to which the first node is connected, and a bulk terminal to which the control voltage is supplied.

14. The voltage level comparison circuit of claim 13, the second driver is configured to include a second transistor having a gate terminal to which the first node is connected, a source terminal to which the external voltage is supplied, a drain terminal to which the second node is connected, and a bulk terminal to which the control voltage is supplied.

15. The voltage level comparison circuit of claim 10, wherein the detection signal generating unit includes a first transistor having a gate terminal to which the output voltage is supplied, a drain terminal to which the first node is connected, and a source terminal to which a ground terminal is connected.

16. The voltage level comparison circuit of claim 15, wherein the detection signal generating unit includes a second transistor having a gate terminal to which the reference voltage is supplied, a drain terminal to which the second node is connected, and a source terminal to which the ground terminal is connected.

17. A semiconductor memory apparatus, comprising:
a voltage adjustment circuit including:
a voltage distributing unit configured to generate a plurality of distributed voltages from an external voltage;
a multiplexer configured to selectively output the plurality of distribution voltages as a control voltage in response to a control signal;
a plurality of drivers, each configured to drive the external voltage and to provide a driving voltage to one of a first node and a second node according to the potential level of the first node;
a plurality of transistors, each having a gate terminal receiving one of the output voltage and the reference voltage, a drain terminal connected to one of the first node and the second node, and a source terminal connected to a ground terminal;
a driver configured to drive the external voltage according to the potential level of the detection signal and to output the external voltage as an output voltage; and
a filter configured to remove noise of the output voltage.

18. The semiconductor memory apparatus of claim 17, wherein the plurality of drivers supply the external voltage to the first and second nodes to increase the potential levels of the first and second nodes when the potential level of the first node is dropped.

19. The semiconductor memory apparatus of claim 17, wherein the plurality of drivers are configured such that an increase rate of the potential levels of the first and second nodes is controlled according to the level of the control voltage when the external voltage is supplied to the first and second nodes.

20. The semiconductor memory apparatus of claim 17, wherein the plurality of the distribution voltages each have different voltage levels.

21. The semiconductor memory apparatus of claim 17, wherein a driving performance of each of the plurality of drives is controlled according to the level of the control voltage.

* * * * *